United States Patent [19]

Hegel

[11] Patent Number: 5,255,157
[45] Date of Patent: Oct. 19, 1993

[54] PLASTIC PIN GRID ARRAY PACKAGE WITH LOCKING PILLARS

[75] Inventor: Uli Hegel, Novato, Calif.

[73] Assignee: National Semiconductor Corporation, Santa Clara, Calif.

[21] Appl. No.: 824,641

[22] Filed: Jan. 24, 1992

[51] Int. Cl.⁵ .............................................. H05K 7/02
[52] U.S. Cl. .................... 361/783; 174/52.2; 257/787; 361/761; 361/807
[58] Field of Search ............. 361/388, 389, 397, 400, 361/401, 412, 417, 420; 174/52.2, 255, 260; 357/68, 70, 71, 72, 74, 80

[56] References Cited

U.S. PATENT DOCUMENTS 4,866,505  9/1989  Roberts et al. ..................... 357/71
5,121,187  6/1992  Yamazaki et al. .................. 357/72

Primary Examiner—Lincoln Donovan
Assistant Examiner—Young S. Whang
Attorney, Agent, or Firm—Gail W. Woodward

[57] ABSTRACT

A plastic pin grid array package is detailed. Where the semiconductor device is mounted within a cavity in the printed wiring board, it is surrounded by a ring of holes that extend completely through the board. When the plastic housing is transfer molded around the face of the board, plastic will enter the holes thereby forming plastic pillars that lock the encapsulant to the board mechanically. When the package is flexed, the pillars will prevent any motion between the encapsulant and the board or the semiconductor device mounted thereupon. The invention can be applied to single or multichip packages. It can be employed in any package that is based upon a printed wiring board substrate.

9 Claims, 2 Drawing Sheets

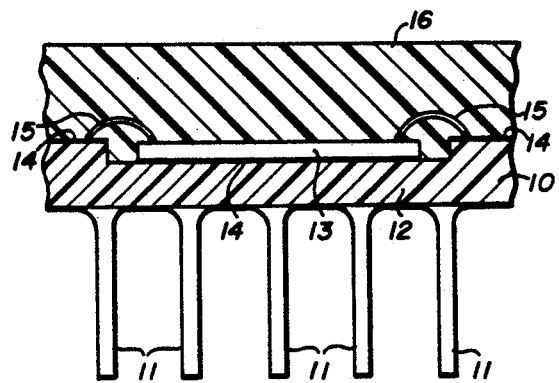
Fig_1 (PRIOR ART)
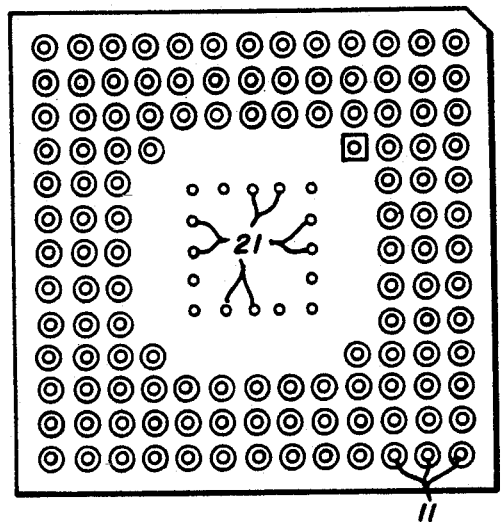
Fig_3
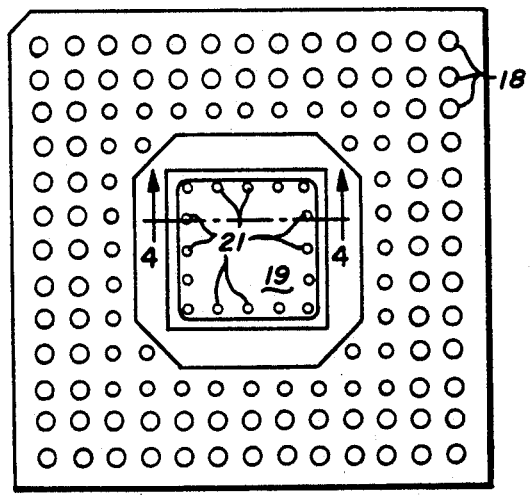
Fig_2
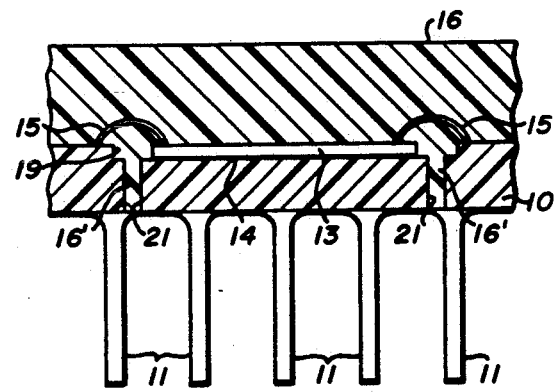
Fig_4

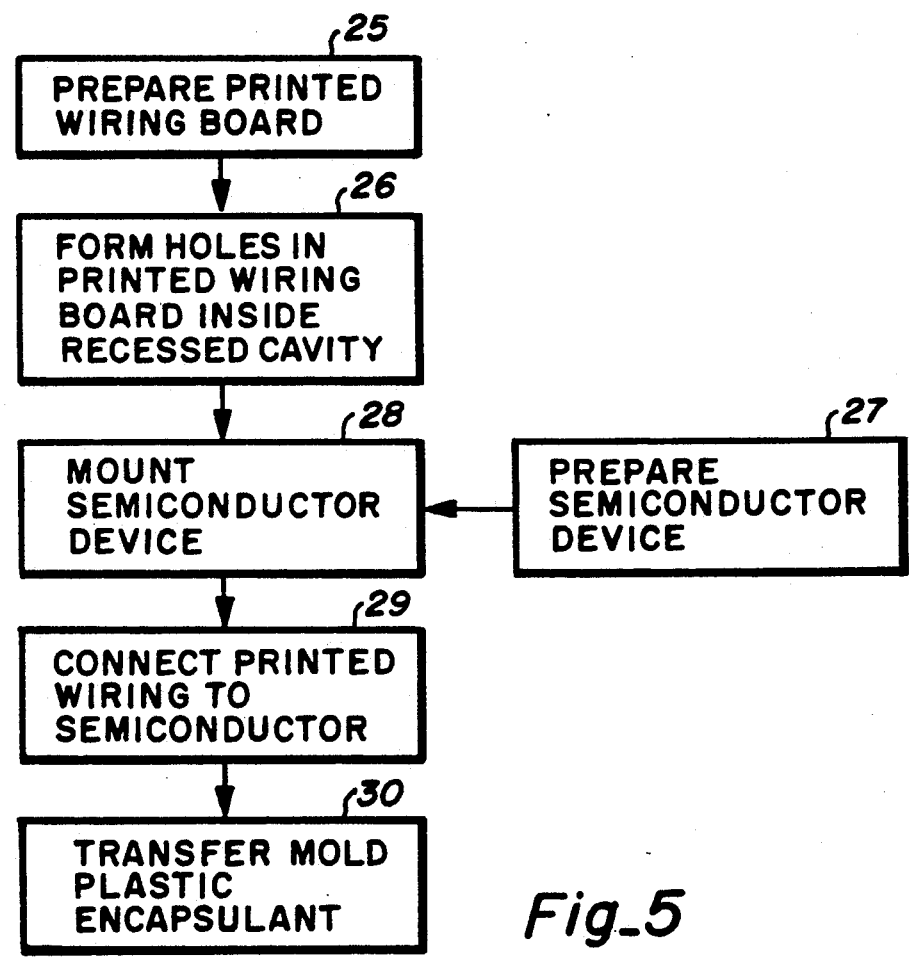
Fig_5

PLASTIC PIN GRID ARRAY PACKAGE WITH LOCKING PILLARS

BACKGROUND OF THE INVENTION

The invention relates to plastic pin grid array (PPGA) packages in which a multilayer printed wiring board (PWB) provided with an array of pins extending from one face thereof. A semiconductor device is attached to the other face and connections are made between the bonding pads of the semiconductor device and metal lands on the PWB which interconnect with the pins. The board is constructed so that metal traces form an array of metal lands, surrounding the semiconductor site, that connect to the pins extending from the opposite face. First, a semiconductor device is mounted on the PWB and connected to the metal lands. Then a plastic housing is transfer molded so as to cover the PWB face holding the semiconductor device and thereby encapsulate it. The plastic encapsulation is described in U.S. Pat. No. 4,688,152 and its divisional process U.S. Pat. No. 4,778,641. The teaching in these two patents is incorporated herein by reference.

The PPGA package has proven to be very useful, in part because a more or less conventional multilayer PWB is employed in its fabrication. The alternative is to use a ceramic multilayer substrate and after the semiconductor device is attached and connected to the ceramic, a plastic or metal cover, of some sort, is applied to provide encapsulation. However, it has been found that the ceramic substrates are subject to relatively high interlead capacitance which seriously reduces the speed of the encapsuated semiconductor devices. Furthermore, such ceramic substrates are expensive thus making their use undesirable.

As shown in the above-referenced patents, the PWB is normally provided with a recess or cavity that accommodates the semiconductor chip. The cavity is typically provided with a metallized bottom to which the semiconductor chip can be soldered or cemented. This metallization is connected to one or more of the array pins so that an external substrate connection is available. The cavity is typically surrounded by an array of metal lands or wiring traces which are also connected, via the multilayer PWB, to the array pins. In assembly the semiconductor device metallization pads are typically interconnected to the metal traces by means of stitch bonded metal wires. Alternatively, a metal spider of the thermal-compression assembly bonding (TAB) type of construction can be employed. The subsequently applied plastic encapsulant covers and protects the semiconductor device and its interconnection means. It also can be extended over the peripheral edges of the PWB to provide a locking skirt which, if desired, can be further extended at the package corners to provide for a package standoff in the final device assembly onto a motherboard.

It is well known that the typical multilayer PWB is flexible to some degree. This dictates that a relatively thick board must be employed so that sufficient rigidity is present and the completed package is not excessively fragile. However, board thickness is a design compromise. After assembly a certain amount of flexure can be encountered. Such flexure can adversely affect the semiconductor device. In an extreme condition the semiconductor device can be fractured. In a lesser flexure condition the connection between the semiconductor device and the PWB can be disrupted. In addition, it is possible that the bond between the plastic encapsulant and the semiconductor surface can be ruptured. In this latter case, the wires that are bonded to the semiconductor device bonding pads can be severed. Accordingly, it would be desirable to provide structural strength for resisting flexure of the PPGA package after assembly.

SUMMARY OF THE INVENTION

It is an object of the invention to provide means for resisting flexure of the PWB substrate in a plastic semiconductor package.

It is a further object of the invention to incorporate plastic pillars in a plastic semiconductor package that extend through the PWB substrate to lock the plastic encapsulant to the substrate.

It is a still further object of the invention to provide an array of holes, extending through a PWB substrate, and surrounding a semiconductor device that is secured thereto so that the plastic encapsulation, employed in a plastic semiconductor package, extends through the holes to create pillars that securely join and lock the encapsulant to the PWB substrate.

These and other objects are achieved in the following manner. The PWB cavity, to be employed in a PPGA package that is to accommodate the semiconductor device, has a plurality of holes located around its inner perimeter. These holes are located outside of the edges of the semiconductor device and they extend completely through the PWB. When the plastic encapsulant is molded, to complete the package, the fluid compound will fill the holes thereby forming pillars that extend through the PWB. These pillars effectively lock the encapsulant to the PWB and act to rigidify the assembly. In flexure, where there would ordinarily be relative motion between the PWB and the encapsulant, the pillars prevent such motion and thereby preclude the failure mode described above.

While the preferred embodiment relates to the PPGA package, the invention can be employed in multichip packages that employ PWB substrates. It can also be employed where semiconductor chips are incorporated directly on a motherboard and plastic encapsulated in place.

BRIEF DESCRIPTION OF THE DRAWING

FIG. 1 is a cross section of a prior art PPGA showing the package cavity and semiconductor device region.

FIG. 2 is a view of a PPGA PWB substrate on the side containing the semiconductor device cavity.

FIG. 3 is a view of the PWB of FIG. 2 on the opposite face showing the package pins.

FIG. 4 is a cross section of the PWB of FIGS. 2 and 3 taken at the line 4-4 of FIG. 2.

FIG. 5 is a block diagram showing the assembly process.

DESCRIPTION OF THE PRIOR ART

FIG. 1 is a cross section of a prior art PPGA package portion showing an encapsulated semiconductor device. PWB substrate 10 is of conventional multilayer construction wherein a plurality of individual layers and their associated metal conductor patterns (not shown) are laminated together to form a unitary structure. Metal vias are included on the individual layers so that a three dimensional wiring structure is present. Metal pins 11 extend from one face of the PWB and are typically soldered into via holes that includes metallization that acts as an interconnect medium for the PWB layers. Metallization rings on the outer face provide the solder fillets shown. The other face of PWB 10 may include a metal pad 14 to which the semiconductor device 13 is bonded. The bonding pads of semiconductor device 13 are joined by wires 15 to PWB metal traces 14 which are located around the periphery of the cavity formed on the PWB face. The traces 14 are connected by the wiring of PWB 10 to pins 11 so that the semiconductor device connections are available by way of the package pins. The assembly is completed by transferring a thermoset molded plastic layer 16 that completes the package. This layer acts to seal the device and protect it after the fashion of the well known dual inline package (DIP) housings. While the FIG. 1 showing includes metal wires 15, that are typically stitch bonded between the bonding pads on semiconductor device 13 and PWB traces 14, other forms of connection can be employed. For example, a metal spider, formed in accordance with the TAB approach, could be employed. Also, conventional beam lead assembly or flip-chip assembly could be used to connect to the PWB. The important elements are that the semicoductor device must be secured mechanically to the PWB and it must be electrically interconnected with the package pins. It can clearly be seen, in FIG. 1, that if the encapsulated assembly is flexed, the elements 10, 13 and 16 will be subjected to shearing motion that can act to disrupt the bonding between the elements.

DESCRIPTION OF THE INVENTION

FIG. 2 is a top view of a PWB that is used to create a PPGA package in accordance with the invention. The circles, identified as 18, represent upper surface metallizations on the PWB where the pins are contactable. While the FIG. 2 showing relates to a specific PPGA configuration, it is to be understood that the invention can apply to any PPGA structure. Three concentric rings of pins are shown totaling 120 pins. Four more inner pins are indicated thus providing a total of 124 pins. As is conventional, the pin spacing is 2540 microns (100 mils). The outer two rings have metallization diameters of 1016 microns and the inner ring involves metallizations that have a diameter of 787 microns.

The region labeled 19 represents a depressed area about 127 microns deep. This is the cavity that will accommodate the semiconductor device (not shown) which will be mounted conventionally therein. The region 20 represents a PWB area where an array of metal traces (not shown) surround the cavity and are located for connections to the semiconductor device bonding pads. These traces have metallization extensions (also not shown) which connect them, by way of the various PWB layers, to the pins on the PPGA package. Thus, the semiconductor device bonding pads can be interconnected with PWB traces and are thereby electrically available at the package pins after the encapsulation is completed.

FIG. 3 shows the pin-face of the PWB. Pins 11 are represented by the smaller circles. The circles surrounding the pins represent PWB metallization to which the pins are soldered to create the package base. As shown in FIGS. 1 and 4, these metallization rings define the solder fillets on the pins. The pins themselves are about 450 microns in diameter and extend about 4570 microns from the PWB face.

The PWB cavity region 19 includes a ring of holes 21 which are located typically inside the cavity rim and extend through the PW board. While sixteen such holes are shown, more or fewer could be used. The location of the holes 21 is controlled so that they ring the semiconductor device after it is mounted in place. These holes can have any reasonable diameter. The diameter must be larger than the critical flow dimension associated with transfer molding of the plastic encapsulant.

After the semiconductor chip is mounted in place inside the cavity the bonding pads are electrically connected to the traces in region 20. This can be done by conventional stitch wire bonding where thin wires act as interconnect elements. Alternatively, a metal spider can be used when employing TAB assembly. While the PPGA shown includes a single semiconductor chip 13, it could incorporate a multichip system. In this case the PWB provides the additional feature of interconnecting the multiple chips.

FIG. 4 is a package cross section taken at line 4-4 of FIG. 2. It can be compared with FIG. 1 for reference. It can be seen that holes 21, which pass completely through the PW board 10, are filled with extensions of the plastic encapsulant 16'. Thus, plastic pillars are formed to lock the encapsulant to the PW board. This minimizes any tendency for the plastic encapsulant to separate from the PW board or the semiconductor device as a result of flexure.

FIG. 5 is a block diagram showing the process of the invention. Block 25 denotes the preparation of the printed wiring board which includes a pin grid array extending from a first face. The second face includes a recessed region which will accommodate the semiconductor. The recess is surrounded by an array of wiring traces that are connected to the package pins and the central portion of the recess includes semiconductor mounting means. As shown in block 26, an array of holes that extend through the printed wiring board is formed inside the periphery of the recess. In block 27 the semiconductor formation is shown. This will be the device that is to be packaged and its structure is a matter of choice. In block 28, the semiconductor is mounted within the recess. In block 29, the connections are made between the semiconductor bonding pads and the printed wiring traces. Finally, the assembly is placed in a transfer mold and a plastic encapsulant transferred into the mold so that it covers the semiconductor device and its connections on the second face of the printed wiring board. During the transfer some of the encapsulant will enter the holes formed in block 26. When the encapsulant is cured it will form pillars within the holes that lock the encapsulant to the printed wiring board. It is to be understood that, if desired, the transfer mold can be shaped so that the plastic encapsulant is also caused to form a skirt around the outer edges of the printed wiring board.

The invention has been described and a preferred embodiment detailed. Alternative embodiments have also been described. It has been shown that, while the preferred embodiment of the invention is a PPGA structure, the invention can be employed in any package that is based upon a PWB substrate. When a person skilled in the art reads the foregoing description, other alternatives and equivalents, within the spirit and intent of the invention, will be apparent. Accordingly, it is intended that the scope of the invention be limited only by the claims that follow.

I claim:

1. A molded plastic semiconductor package comprising:

a printed wiring board having at least one semiconductor device mounted thereupon;

said printed wiring board having an array of traces having tips that form a pattern surrounding the periphery of said semiconductor device;

means for electrically connecting a trace pattern to said semiconductor device;

said printed wiring board further including a plurality of holes that extend completely therethrough in the trace pattern that surrounds the periphery of said semiconductor device; and a molded plastic encapsulant covering said semiconductor device and extending over said printed wiring board to cover said means for electrically connecting said trace pattern to said semiconductor device and wherein said plastic encapsulant includes posts that extend through said plurality of holes to mechanically lock said encapsulant to said printed wiring board.

2. The molded plastic semiconductor package of claim 1 wherein said printed wiring board has a plurality of semiconductor devices mounted thereupon.

3. The molded plastic semiconductor package of claim 1 wherein said package is a plastic pin grid array and said printed wiring board includes a first face having a plurality of package pins extending therefrom and a second face which includes means for mounting and connecting to said semiconductor device.

4. The molded plastic semiconductor package of claim 3 wherein said printed wiring board second face includes a recessed cavity within which the semiconductor device is located and said plurality of holes is located between the periphery of said semiconductor device and the edge of said recess.

5. The molded plastic semiconductor package of claim 4 wherein said holes have a diameter that exceeds the critical dimension of fluid flow.

6. The molded plastic semiconductor package of claim 3 wherein said plastic encapsulant is extended to form a skirt that embraces the peripheral edge of said printed circuit wiring board.

7. The process for forming a molded plastic semiconductor chip package comprising the steps:

forming a printed wiring board to have connection means extending therefrom and to have mounting means for at least one semiconductor chip on a face thereof;

forming a plurality of holes that extend through said printed wiring board in a pattern surrounding said semiconductor chip mounting means whereby said holes closely surround said semiconductor chip after it is mounted;

forming a semicnductor chip device;

mounting said semiconductor chip on said mounting means;

connecting said semiconductor chip to said printed wiring board traces; and molding a plastic encapsulant to cover said semiconductor chip and its connecting means whereby said encapsulant extends through said holes thereby to lock said encapsulant in place.

8. The process of claim 7 wherein said printed wiring board is formed to have mounting means for a plurality of semiconductor chips.

9. The process of claim 7, including the steps of forming a recess in said printed wiring circuit board that is shaped to accommodate said semiconductor chip mounting means and forming said plurality of holes inside said recess.

* * * * *